(12) United States Patent
Richards

(10) Patent No.: US 6,661,017 B1
(45) Date of Patent: Dec. 9, 2003

(54) ION IMPLANTATION SYSTEM HAVING AN ENERGY PROBE

(75) Inventor: Steven Richards, Georgetown, MA (US)

(73) Assignee: Ibis Technology Corporation, Danvers, MA (US)

( * ) Notice: Subject to any disclaimer, the term of this patent is extended or adjusted under 35 U.S.C. 154(b) by 0 days.

(21) Appl. No.: 10/157,091

(22) Filed: May 29, 2002

(51) Int. Cl.[7] .......................... A61N 5/00; H05B 31/26
(52) U.S. Cl. ..................... 250/492.21; 315/111.81
(58) Field of Search ................. 315/111.21, 111.31, 315/111.81, 111.91; 250/441.11, 492.21, 492.22, 492.23

(56) References Cited

U.S. PATENT DOCUMENTS

| | | | | |
|---|---|---|---|---|
| 4,797,597 A | * | 1/1989 | Bostrom | 315/39 |
| 5,672,882 A | * | 9/1997 | Day et al. | 250/492.21 |
| 6,130,436 A | * | 10/2000 | Renau et al. | 250/492.21 |
| 6,297,510 B1 | * | 10/2001 | Farley | 250/492.21 |
| 6,462,331 B1 | * | 10/2002 | Choi et al. | 250/251 |

* cited by examiner

Primary Examiner—Don Wong
Assistant Examiner—Minh Du A
(74) Attorney, Agent, or Firm—Thomas J. Engellenner; Reza Mollaaghababa; Nutter McClennen & Fish

(57) ABSTRACT

The present invention provides improved ion implantation systems and methods in which a high voltage probe is utilized in an ion implantation system to directly measure energy of an ion beam incident on a substrate. More particularly, an exemplary ion implantation system can include an ion source maintained at a high electric potential that generates ions, and a plurality of extraction electrodes that can accelerate the ions to a desired energy. The system further includes an end-station, maintained at ground electric potential, in which a wafer holding for positioning a wafer in the path of an ion beam is disposed. The ion implantation system is further characterized by a high energy probe disposed between a high voltage terminus of the ion source and ground for directly measuring the energy of the ions.

11 Claims, 1 Drawing Sheet

ION IMPLANTATION SYSTEM HAVING AN ENERGY PROBE

BACKGROUND

The present invention relates generally to systems and methods for ion implantation, and more particularly, to such systems and methods that allow facile and accurate measurement of energy of an ion beam utilized for implanting ions in a substrate.

Ion implantation is used routinely in many material-processing applications. For example, in SIMOX (separation-by-implantation-of-oxygen) applications, oxygen ions can be implanted into a semiconductor substrate, e.g., a silicon wafer, to generate a buried insulating layer, e.g., $SiO_2$, through subsequent annealing steps. In many such applications, the energy of the ions impacting a substrate needs to be in a predefined range to ensure obtaining a desired effect. For example, in SIMOX processing, the penetration depth of ions in a wafer can be varied by choosing different energies for an ion beam impacting the wafer.

Controlling the energy of the ions requires the ability to measure the ion energy. In many ion implantation systems, ions transit through a number of stages that can provide charge selection, acceleration and beam forming. The ions can be subjected to voltage differentials at one or more of these stages, each of which can change the ion energy. Hence, determining the ion energy can be a time-consuming process that may require multiple measurements, additions and/or subtractions, each having an associated error.

Thus, there is a need for enhanced methods and systems for accurately measuring the energy of ions in an ion implantation system.

There is also a need for such methods and systems that allow readily measuring the ion energy in an ion implantation system without the need for performing multiple measurements.

SUMMARY OF THE INVENTION

The present invention provides an ion implantation system that can include an ion source maintained at a high electric potential for generating ions of a selected species. The implantation system can further include a plurality of extraction electrodes that accelerate the ions from the source to an end station that is maintained at a nominal ground electric potential. A wafer holder disposed at the end station can hold a wafer in the path of the accelerated ions. The implantation system is further characterized by a high voltage probe that is disposed between a high voltage terminus of the ion source and ground. The high voltage probe advantageously allows direct measurement of the energy of an ion beam utilized for implantation.

In another aspect, the high voltage probe can measure voltages corresponding to maximum beam energy that an implanter in which the probe is incorporated can provide, for example, 300 volts. Further, the high voltage probe can include a voltage divider that is configured to generate a calibrated ratio of a voltage applied across the probe. The voltage ratio is preferably in a range that can be safely and readily read out, for example, by a voltmeter. For example, the calibrated ratio can be 30,000:1.

In a related aspect, the high voltage probe can contain a fluid, for example, $SF_6$ gas, that exhibits a high dielectric breakdown strength so that the probe can be manufactured with physical dimensions that are not exorbitantly large.

Further understanding of the invention can be obtained by reference to the following description in conjunction with the drawing which is described briefly below.

DETAILED DESCRIPTION

Figure 1:
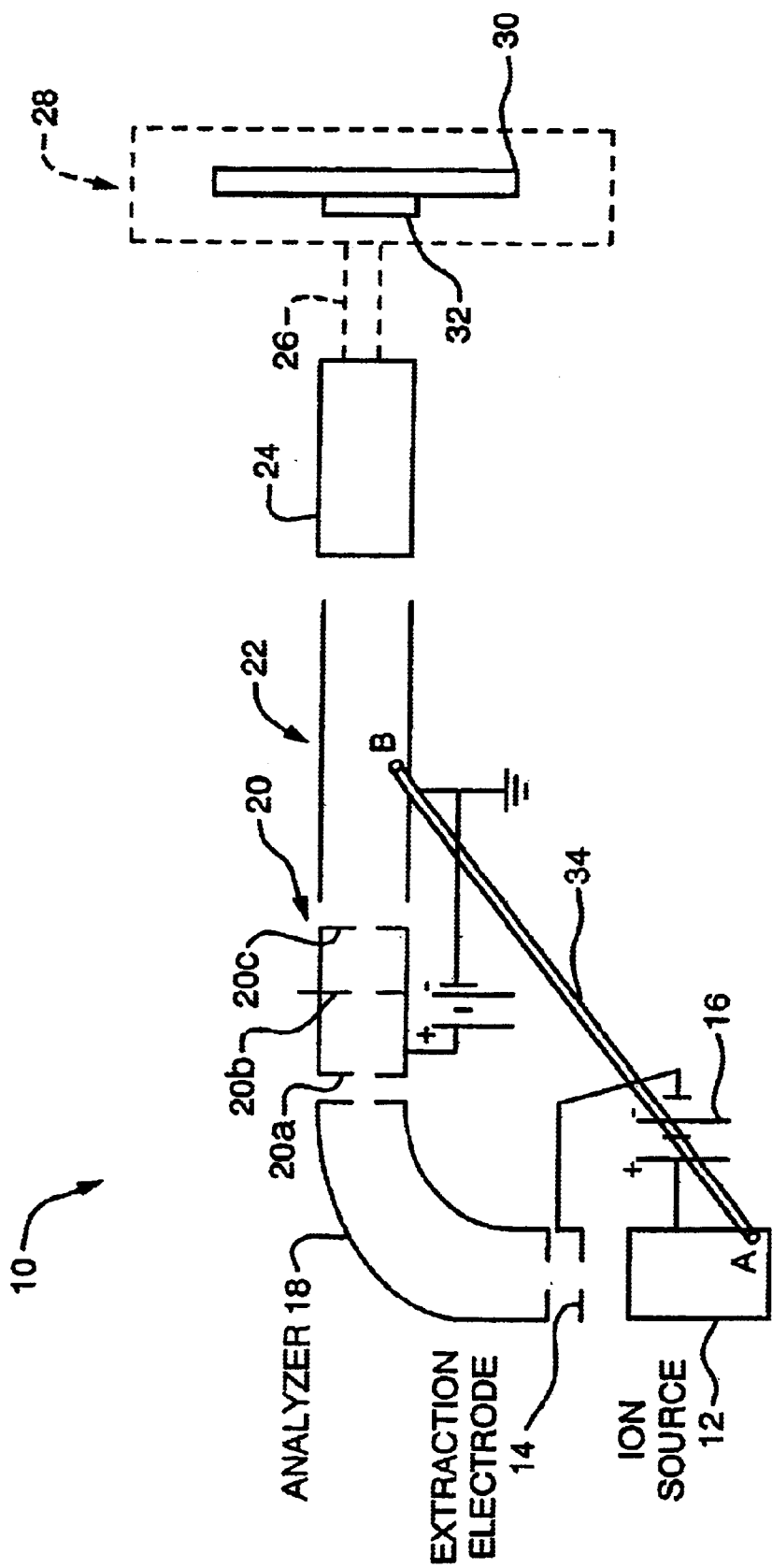
FIG. 1 illustrates a schematic diagram of an ion implantation system in which a high voltage probe is utilized in accordance with the teachings of the invention to measure an energy of an ion beam employed for implanting ions in a substrate.

The present invention provides an improved ion implantation system in which a high energy probe disposed between an ion source and ground is utilized to measure energy of an ion beam employed for implanting ions in a substrate, e.g., a semiconductor wafer.

More particularly, FIG. 1 schematically depicts an ion implantation system according to the teachings of the invention that includes an ion source 12, maintained at a high electric potential for generating ions of a selected species, e.g., oxygen. The ion source can be maintained at a voltage of about 10 kV to about 250 kV relative to ground (about 10 kV to about 100 kV relative to source terminal, e.g., terminal A depicted below, depending on the terminal potential). The ion implantation system 10 further includes an extraction electrode 14 for drawing the ions from the ion source 12. The extraction electrode 14 is maintained at a selected voltage differential relative to the ion source by utilizing, for example, a voltage source 16. The extraction electrode 14 can be held at a negative or positive potential relative to the ion source depending on the sign of the charge of ions, i.e., positive or negative, to be extracted.

The exemplary implantation system 10 further includes an analyzer 18, for example, a magnetic analyzer, which selects appropriately charged ions. An ion accelerator 20 formed, for example, of a plurality of electrodes 20a, 20b, and 20c, each of which is maintained at a selected electric potential, accelerates the ions to a desired energy range, for example, in a range of about 10 keV to about 200 keV.

Upon leaving the accelerator 20, the ion beam enters a transit region 22, maintained at ground electric potential, that extends to a beam forming device 24. The beam forming device 24 shapes the accelerated ions. into an ion beam 26 having selected cross-sectional shape and area.

The exemplary implantation system 10 further includes an end station 28 having a wafer holder 30 on which a substrate 32, e.g., a semiconductor wafer, can be disposed to face the ion beam 26.

With continued reference to FIG. 1, the implantation system 10 includes a high-energy voltage probe 34 that is disposed between a high voltage terminus of the ion source 12 and the transit region 22, which is held at ground electric potential. The probe 34 advantageously allows direct measurement of a voltage differential between points A and B (herein referred to as $V_{AB}$). Because the voltage difference $V_{AB}$ corresponds to a sum of voltage differentials to which the ions are subjected as they travel from the ion source 12 to the transit region 22, a direct measurement of $V_{AB}$ provides a direct measurement of the energy of the ions as they exit the accelerator 20.

Various commercially available, high energy probes can be utilized for practicing the invention. For example, high voltage probes manufactured by Ross Engineering Corporation of Campbell, Calif., U.S.A under trade designations VMP and VMDP are suitable for use in an ion implantation system of the invention. However, the probe should exhibit high dielectric breakdown strength. Preferably, the dielectric breakdown strength should be greater than a maximum voltage corresponding to maximum energy of ions in an implanter, in which the probe is incorporated. For example, the breakdown voltage can be greater than above 300 kV. One such probe includes a 1000:1 voltage divider disposed in a tube that is filled with sulfur hexafluoride ($SF_6$) gas, which provides high dielectric breakdown strength. This dielectric property of the $SF_6$ gas advantageously allows manufacturing the probe with physical dimensions that are not exorbitantly large. The output of the probe is a DC voltage that equals $1/1000$ of the voltage applied between the two ends of the probe, e.g., between points A and B in the exemplary ion implantation system of FIG. 1. This DC voltage is referenced to the ground potential, and hence can be conveniently measured by a voltmeter.

In many ion implantation applications, the energy of the ions impacting a substrate is selected to be within a particular range. For example, in SIMOX processes in which oxygen ions are implanted in a substrate, e.g., a silicon wafer, in one or more processing steps, the energy of the ions in each implantation step is typically selected to be at a desired value, e.g., 200 keV. Controlling the energy of the ions necessitates methods and systems for measuring the ion energy. As discussed above, in an implantation system of the invention, such as the exemplary system 10, the probe 34 advantageously allows measuring the ion energy directly and accurately in one measurement step.

In the absence of the probe 34 in the implantation system 10, the ion energy must be determined by measuring and combining the voltage differentials applied to the ions at different stages from the source 12 to the transit region 22. For example, the voltage differential between the source 12 and the extraction electrode 14 can be added to the voltage differential across the accelerator 20 to obtain the total voltage differential to which the ions are subjected. This multi-step measurement process is, however, time-consuming, and more significantly, it is prone to inaccuracy because a measurement error associated with one stage is combined with a corresponding error in a subsequent stage. The use of the probe 34, as described above, obviates the need for such a multi-step measurement process, and advantageously allows facile and accurate measurement of the ion energy.

A high voltage probe of the invention as described above can also be utilized to measure the total energy of an ion beam in implanter systems that utilize deceleration rather than acceleration subsequent to an ion extraction stage. For example, such a probe can be utilized in a system that extracts ions at about 50 keV, decelerate the ions by 40 keV to obtain ions at an energy of about 10 keV for implantation.

Those having ordinary skill in the art will appreciate that various modifications can be made to the above systems and methods without departing from the scope of the invention. For example, the high energy probe can be utilized in a manner described above in ion implantation systems that include more or less components that those shown in the exemplary embodiment described above.

What is claimed is:

1. In an ion implantation system having an ion source maintained at a high electric potential, a grounded end station adapted for holding wafers and a plurality of extraction electrodes accelerating the ions from the source and directing an ion beam onto the wafers of the end station, the improvement comprising
a high voltage probe disposed between a high voltage terminus of the ion source and ground.

2. In the ion implantation system of claim 1, wherein the high voltage probe exhibits a dielectric breakdown strength greater than about 300 kV.

3. In the ion implantation system of claim 1, wherein the high voltage probe is capable of measuring voltages in a range of about 10 kV to about 250 kV.

4. In the ion implantation system of claim 2, wherein said high voltage probe includes a calibrated voltage divider.

5. In the ion implantation system of claim 3, wherein the voltage divider generates an output voltage having 1:30,000 ratio relative to a voltage applied across the high energy probe.

6. In the ion implantation system of claim 1, wherein the high voltage probe is disposed in said ion implantation system to measure directly energy of ions subsequent to travel through said extraction electrodes.

7. In the ion implantation system of claim 1, wherein the ion source is maintained at an electric potential in a range of about 10 kV to about 250 kV relative to ground.

8. In the ion implantation system of claim 1, wherein the extraction electrodes apply an electrical voltage in a range of about 10 kV to about 100 kV to the ions.

9. In a method of implanting wafers positioned a grounded end station of an ion implantation chamber with ions generated by an ion source maintained at a high electric potential, and accelerated by a plurality of extraction electrodes to a selected energy range to be directed as an ion beam to the wafers, the improvement comprising:
disposing a high voltage probe between a high voltage terminus of the ion source and ground to directly measure ion energy in said end station prior to ion impact with the wafers.

10. In the method of claim 9, further comprising selecting said high voltage probe to include a calibrated voltage divider.

11. In an ion implantation system having an ion source maintained at a high electric potential, a grounded end station adapted for holding wafers, an extraction stage for extracting ions from the source, and a deceleration stage for decelerating the extracted ions to a selected energy to be directed onto the wafers of the end station, the improvement comprising
a high voltage probe disposed between a high voltage terminus of the ion source and ground.

* * * * *